(12) United States Patent  
Ge et al.

(10) Patent No.: US 12,034,020 B2  
(45) Date of Patent: Jul. 9, 2024

(54) CVD PREPARATION METHOD FOR MINIMIZING CAMERA MODULE DOT DEFECTS AND PRODUCT THEREOF

(71) Applicant: HANGZHOU MDK OPTO ELECTRONICS CO., LTD, Hangzhou (CN)

(72) Inventors: Wenzhi Ge, Hangzhou (CN); Yiwei Wang, Hangzhou (CN); Gang Wang, Hangzhou (CN); Kevin Weng, Hangzhou (CN); Hirokazu Yajima, Hangzhou (CN); Junnan Jiang, Hangzhou (CN)

(73) Assignee: HANGZHOU MDK OPTO ELECTRONICS CO., LTD, Hangzhou (CN)

( * ) Notice: Subject to any disclaimer, the term of this patent is extended or adjusted under 35 U.S.C. 154(b) by 1001 days.

(21) Appl. No.: 16/969,572

(22) PCT Filed: May 15, 2020

(86) PCT No.: PCT/CN2020/090570  
§ 371 (c)(1),  
(2) Date: Aug. 13, 2020

(87) PCT Pub. No.: WO2021/082400  
PCT Pub. Date: May 6, 2021

(65) Prior Publication Data  
US 2022/0302193 A1 Sep. 22, 2022

(30) Foreign Application Priority Data

Nov. 1, 2019 (CN) .......................... 201911060084.7  
Dec. 30, 2019 (CN) .......................... 201911387147.X

(51) Int. Cl.  
*C23C 16/40* (2006.01)  
*C23C 16/02* (2006.01)  
(Continued)

(52) U.S. Cl.  
CPC .... H01L 27/14618 (2013.01); *C23C 16/0227* (2013.01); *C23C 16/402* (2013.01);  
(Continued)

(58) Field of Classification Search  
CPC . C23C 16/0227; C23C 16/402; C23C 16/403; C23C 16/405; C23C 16/455  
See application file for complete search history.

(56) References Cited

U.S. PATENT DOCUMENTS

2003/0122204 A1* 7/2003 Nomoto ................ H01L 29/792  
257/E21.21  
2016/0266281 A1* 9/2016 Marshall ................ G02B 1/116

FOREIGN PATENT DOCUMENTS

| CN | 102903726 A | 1/2013 |
| CN | 102983144 A | 3/2013 |

(Continued)

OTHER PUBLICATIONS https://web.archive.org/web/20171007011450/https://www.ctgclean.com/ultrasonic-cleaning-fundamental-theory-and-application (Year: 2017).*

*Primary Examiner* — Nathan H Empie  
(74) *Attorney, Agent, or Firm* — Bayramoglu Law Offices LLC

(57) ABSTRACT

A CVD preparation method for minimizing camera module dot defects includes: performing ultrasonic cleaning and drying on a base substrate to obtain a pre-treated base substrate; placing the pre-treated base substrate into a reaction chamber, evacuating, and introducing nitrogen or inert gas to slightly positive pressure; simultaneously introducing  
(Continued)

precursor I and precursor II at a temperature of 500-700° C. to deposit a low-refractive-index L layer on the base substrate; halting introduction of the precursor I and the precursor II, and purging the reaction chamber with nitrogen or the inert gas; introducing raw gas precursor III and precursor IV at a temperature of 600-800° C. to deposit a high-refractive-index H layer on the low-refractive-index L layer; and halting introduction of the precursor III and precursor IV, and purging the reaction chamber with nitrogen or inert gas; and cooling to room temperature to obtain an optical element with coating films having different refractive indices.

6 Claims, 4 Drawing Sheets

(51) Int. Cl.
*C23C 16/455* (2006.01)
*H01L 27/146* (2006.01)
*H04N 23/54* (2023.01)

(52) U.S. Cl.
CPC .......... *C23C 16/403* (2013.01); *C23C 16/405* (2013.01); *C23C 16/45536* (2013.01); *C23C 16/45553* (2013.01); *C23C 16/45555* (2013.01); *H01L 27/14625* (2013.01); *H01L 27/14643* (2013.01); *H01L 27/14685* (2013.01); *H04N 23/54* (2023.01); *H01L 27/14689* (2013.01)

(56) References Cited

FOREIGN PATENT DOCUMENTS

| | | | |
|---|---|---|---|
| CN | 106547160 A | 3/2017 | |
| CN | 109860250 A | 6/2019 | |
| CN | 110767668 A | 2/2020 | |
| CN | 110885969 A | 3/2020 | |
| EP | 0484922 A * | 5/1992 | ............... B41J 2/45 |
| JP | 2006056036 A * | 3/2006 | ............. C08J 7/045 |
| JP | 2010127947 A | 6/2010 | |
| JP | 2011258613 A | 12/2011 | |
| WO | WO-0129282 A2 * | 4/2001 | ............. C23C 16/44 |

* cited by examiner

CVD PREPARATION METHOD FOR MINIMIZING CAMERA MODULE DOT DEFECTS AND PRODUCT THEREOF

CROSS REFERENCE TO THE RELATED APPLICATIONS

This application is the national phase entry of International Application No. PCT/CN2020/090570, filed on May 15, 2020, which is based upon and claims priority to Chinese Patent Application No. 201911060084.7, filed on Nov. 1, 2019; and No. 201911387147.X, filed on Dec. 30, 2019, the entire contents of which are incorporated herein by reference.

TECHNICAL FIELD

The present invention relates to the technical field of camera modules, and more particularly, to a chemical vapor deposition (CVD) preparation method for minimizing camera module dot defects and a product thereof.

BACKGROUND

The optical lens and camera module industry is being driven by high-definition camera imaging demands needed in intelligent terminals, scanners, smartphones, projectors, in-vehicle products, security monitoring and other industries, as well as the broad application of augmented reality, three-dimensional (3D) technology and gesture recognition technology in the field of artificial intelligence.

Dots are a kind of undesirable defect that appears in an optical lens and camera module. Dots refer to a dot-shaped protrusion formed on the substrate surface and are sometimes called particles. During current optical coating processes, including vacuum thermal evaporation and magnetron sputtering, large particle film material dots are inevitably deposited on the substrate surface along with film vapor or sputtered particles, thus forming dots. The dots are generally individual dots and even fine dots that form one piece in some cases. Large particle dots even damage the substrate surface and seriously affect imaging. Thus, most manufacturers require that the dots in the optical elements should have a size not exceeding 5 μm in order to ensure the imaging effect.

In a majority of current optical elements, however, the surfaces need to be coated with various kinds of films to obtain the desired optical performance. This process is typically accomplished by coating one or more metal layers or dielectric films on the surface of an optical part to reduce or increase light reflection, beam splitting, color separation, filtering, polarization and the like. The optical coating process typically adopts vacuum thermal evaporation (deposition) and magnetron sputtering. An effective means for controlling or minimizing dots, however, remains absent in the prior art.

In vacuum thermal evaporation, a substance is heated and evaporated under vacuum conditions to form a vapor and deposited onto the surface of the substrate to form a solid film. The process involves: (1) thermal energy conversion methods of various forms (such as resistance heating, electronic heating, high frequency induction heating, arc heating, laser heating, and the like) are employed to vaporize or sublimate coating material particles into energized gaseous particles; (2) the gaseous particles are transferred to the substrate through a linear movement substantially without collision; (3) the particles are deposited on the surface of the substrate and condensed into a film; and (4) the component atoms of the film rearrange or undergo chemical bonding. Since the heating and condensation processes cannot be absolutely uniform, large droplets or particles inevitably appear. The dot defect in the optical coating cannot be effectively controlled, and dots with a particle size exceeding 5 μm are likely to appear. This is unacceptable for high quality imaging.

The magnetron sputtering is a technique that uses charged particles to bombard the target surface in a vacuum to deposit the bombarded particles on the substrate. Magnetron sputtering includes: (1) under the action of an electric field E, electrons collide with argon atoms in the course of moving to the substrate, causing them to be ionized to generate Ar positive ions and new electrons; (2) the new electrons move to the substrate, and the Ar ions accelerate to a cathode target under the action of the electric field and bombard the target surface with high energy to cause sputtering of the target material; and (3) in the sputtered particles, neutral target atoms or molecules are deposited on the substrate to form a film. Similarly, in the process of bombarding the target, large particles are very likely to be generated and deposited on the substrate to form dots, which cannot be effectively controlled and are unacceptable for quality imaging.

In the industrial production of optical lenses and camera modules, there is no effective way to control the generation and quantity of dot defects. This not only reduces the number of products meeting quality standards but also increases production costs. It is, therefore, highly desirable to develop an improved production process that minimizes the presence of dots or altogether eliminates them.

SUMMARY

In view of the above-mentioned shortcomings in the prior art, the first objective of the present invention is to provide a CVD preparation method for minimizing camera module dot defects, which fundamentally eliminates the formation path of dots without generating micron-sized dot defects.

The second objective of the present invention is to provide a multilayer film structure, a package cover plate, a ceramic leadless chip carrier (CLCC) package and a camera module obtained using the above preparation method, which significantly reduces the undesirable dot defects.

In order to achieve the above-mentioned objectives, the present invention adopts the following technical solution, including:

S1: performing ultrasonic cleaning and drying on a base substrate to obtain a pre-treated base substrate;

S2: placing the pre-treated base substrate into a reaction chamber, evacuating, and introducing nitrogen or inert gas to a slightly positive pressure;

S3: simultaneously introducing a precursor I and a precursor II at a temperature of 500-700° C. to deposit and form a low-refractive-index L layer on the base substrate, wherein a flow rate of silane is 10-80 sccm, and a flow rate of oxygen is 20-80 sccm;

S4: halting introduction of precursor I and precursor II, and purging the reaction chamber with nitrogen or inert gas;

S5: introducing a raw gas precursor III and precursor IV at a temperature of 600-800° C. to deposit a high-refractive-index H layer on the low-refractive-index L layer, wherein a flow rate of the precursor III is 20-90 sccm, a flow rate of the precursor IV is 20-60 sccm;

S6: halting introduction of the raw gas precursor III and precursor IV, and purging the reaction chamber with nitrogen or inert gas; and S7: cooling to room temperature to obtain an optical element with coating films having different refractive indices; wherein a refractive index of the high-refractive-index H layer is greater than a refractive index of the low-refractive-index L layer.

Further, the above preparation method further includes periodically repeating steps S3-S4 and/or S5-S6.

Further, in the above preparation method, the coating films of the optical element include: a combination of silicon dioxide ($SiO_2$) low-refractive-index L layer and titanium dioxide ($TiO_2$) high-refractive-index H layer; a combination of $SiO_2$ low-refractive-index L layer and niobium pentoxide ($Nb_2O_5$) high-refractive-index H layer; a combination of $SiO_2$ low-refractive-index L layer and tantalum pentoxide ($Ta_2O_5$) high-refractive-index H layer; a combination of magnesium fluoride ($MgF_2$) low-refractive-index L layer and $TiO_2$ high-refractive-index H layer; a combination of $MgF_2$ low-refractive-index L layer and $Nb_2O_5$ high-refractive-index H layer; a combination of $Nb_2O_5$ low-refractive-index L layer and $Ta_2O_5$ high-refractive-index H layer; a combination of $MgF_2$ low-refractive-index L layer, $Al_2O_3$ high-refractive-index H layer and $SiO_2$ low-refractive-index L layer; a combination of aluminum oxide ($Al_2O_3$) low-refractive-index L layer, lanthanum titanium oxide (H4) high-refractive-index H layer and $MgF_2$ low-refractive-index L layer; and a combination of $Al_2O_3$ low-refractive-index L layer, zirconium dioxide ($ZrO_2$) high-refractive-index H layer and $MgF_2$ low-refractive-index L layer.

Further, in the above preparation method, in a two-component material film structure, the difference between the refractive index of the high-refractive-index H layer and the refractive index of the low-refractive-index L layer is greater than or equal to 0.5. The greater the difference in refractive index between two layers, the better the optical performance. However, the greater the difference in refractive index, the more difficult it is to achieve with a one-step process.

Further, in the above preparation method, the base substrate is a glass, crystal or sapphire substrate.

Further, in the above preparation method, the precursor I is one selected from the group consisting of $SiH_4$, $SiHCl_3$, $SiCl_2H_2$, $SiCl_4$, $Al(CH_3)_3$ and $Cp_2Mg$. The precursor II is at least one selected from the group consisting of $O_2$, $O_3$, $CO_2$, $CO$, $NO_2$, $NO$, $H_2O$ and $F_2$. The precursor III is one selected from the group consisting of $TiH_4$, $TiCl_4$, $NbCl_5$, $TaCl_5$ and $ZrCl_4$. The precursor IV is at least one selected from the group consisting of $O_2$, $O_3$, $CO_2$, $CO$, $NO_2$, $NO$, $H_2O$ and $F_2$.

A multilayer film structure, wherein the multilayer film structure is prepared by the above CVD preparation method.

Further, in the above multilayer film structure, the number of dots with a size greater than or equal to 1 μm is 0.

Further, a surface roughness Ra of the multilayer film structure ranges from 0.01 nm to 20 nm.

A CLCC package cover plate, wherein the CLCC package cover plate includes a cover plate substrate and a functional film covering the cover plate substrate, and the functional film includes a multilayer film structure. The multilayer film structure is deposited by the above CVD preparation method.

A CLCC package, wherein the CLCC package includes a substrate. A Complementary Metal Oxide Semiconductor (CMOS) is attached in the middle of the substrate. A capacitor resistor and a driving motor are attached on the edge of the substrate. A separation wall base is provided on the substrate. A CMOS sensor vacancy, a capacitor resistor vacancy and a driving motor vacancy are provided at positions on the separation wall base corresponding to the CMOS, the capacitor resistor and the driving motor on the substrate, respectively. The cover plate is mounted on the upper surface of the CMOS sensor vacancy.

A camera module, wherein the camera module includes the CLCC package.

The advantages of the technical solution of the present invention are as follows:

(1) Through chemical vapor deposition (CVD), alternate deposition of multiple high-refractive-index and low-refractive-index layers of the optical element can be achieved in one time. The reaction materials are reacted and deposited on the base substrate in the reaction chamber in the gas phase without evaporation or sputtering processes, which eliminates the source of dot defects and avoids the formation of large particle dot defects. This significantly enhances the imaging quality of the camera module so that CVD has practical application in the processing of a camera module.

(2) The product provided by the present invention achieves multilayer coating of the optical element through chemical vapor deposition. Without evaporation or sputtering processes, the reaction materials are deposited on the base substrate through a gas phase reaction to avoid the formation of large particle dot defects, which not only significantly enhances the imaging quality of the camera module but also improves the product quality. Moreover, the optical coating film is smoother, has higher firmness and is more practical.

(3) The surface of the cover plate of the present invention is precisely controlled to avoid the formation of large-sized dots on the surface, much lower than the 5 μm requirement in the prior art, which overcomes the adverse factors that limit the improvement of CMOS pixels, and dramatically improves the pixel level of the CLCC package and the camera module.

Figure 1:
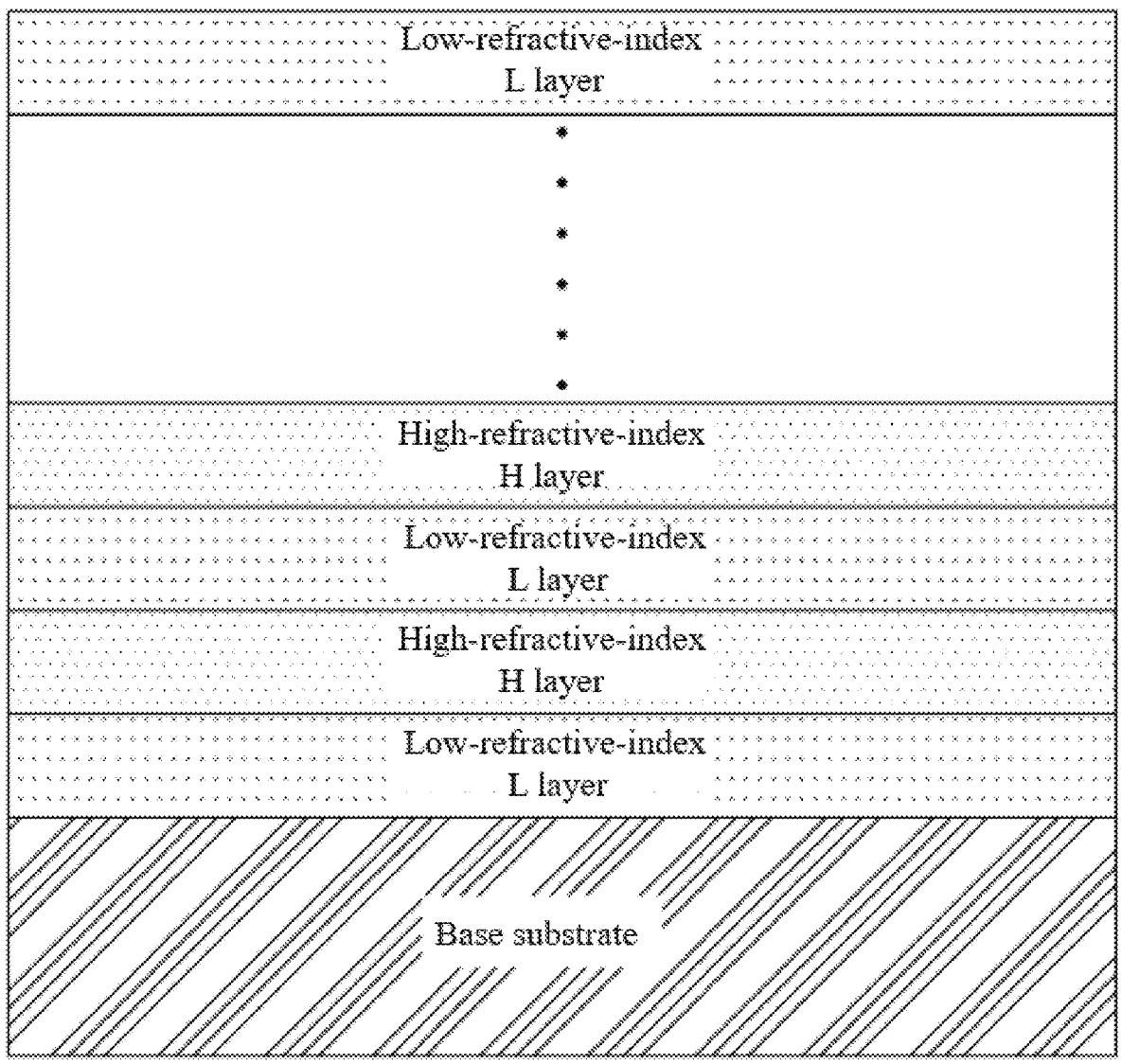
FIG. 1 is a schematic diagram of the multilayer film structure of the present invention.

Reference numerals: 1, substrate; 2, CMOS; 3, capacitor resistor; 4, driving motor; 5, separation wall base; 6, cover plate.

DETAILED DESCRIPTION OF THE EXEMPLARY EMBODIMENTS

The present invention will be further described with reference to the drawings and embodiments. The refractive index of the present invention is set to be obtained under the d-line of a helium (He) light source, and a wavelength of the d-line is 587.56 nm.

A CVD preparation method for minimizing camera module dot defects includes the following steps:

S1: Ultrasonic cleaning and drying are performed on a base substrate to obtain a pre-treated base substrate.

S2: The pre-treated base substrate is placed into a reaction chamber, the reaction chamber is evacuated, and nitrogen or inert gas is introduced into the reaction chamber to slightly positive pressure.

S3: The precursor I and the precursor II are simultaneously introduced at a temperature of 500-700° C. to deposit and form a low refractive index L layer on the base substrate, wherein a flow rate of silane is 10-80 sccm, and a flow rate of oxygen is 20-80 sccm.

S4: Introduction of the precursor I and the precursor II is halted, and the reaction chamber is purged with nitrogen or inert gas.

S5: At a temperature of 600-800° C., the raw gas precursor III and precursor IV are introduced to deposit a high-refractive-index H layer on the low-refractive-index L layer, wherein a flow rate of the precursor III is 20-90 sccm, and a flow rate of the precursor IV is 20-60 sccm.

S6: Introduction of the raw gas precursor III and precursor IV is halted, and the reaction chamber is purged with nitrogen or inert gas.

S7: The reaction chamber is cooled to room temperature to obtain an optical element with coating films having different refractive indices; wherein the refractive index of the high-refractive-index H layer is greater than the refractive index of the low-refractive-index L layer. The above optical element can be subjected to secondary heating treatment, plasma treatment and the like to further improve the optical performance.

Further, the above preparation method further includes periodically repeating steps S3-S4 and/or S5-S6.

Further, in the above preparation method, the coating films of the optical element include: a combination of $SiO_2$ low-refractive-index L layer and $TiO_2$ high-refractive-index H layer; a combination of $SiO_2$ low-refractive-index L layer and $Nb_2O_5$ high-refractive-index H layer; a combination of $SiO_2$ low-refractive-index L layer and $Ta_2O_5$ high-refractive-index H layer; a combination of $MgF_2$ low-refractive-index L layer and $TiO_2$ high-refractive-index H layer; a combination of $MgF_2$ low-refractive-index L layer and $Nb_2O_5$ high-refractive-index H layer; a combination of $Nb_2O_5$ low-refractive-index L layer and $Ta_2O_5$ high-refractive-index H layer; a combination of $MgF_2$ low-refractive-index L layer, $Al_2O_3$ high-refractive-index H layer and $SiO_2$ low-refractive-index L layer; a combination of $Al_2O_3$ low-refractive-index L layer, H4 high-refractive-index H layer and $MgF_2$ low-refractive-index L layer; and a combination of $Al_2O_3$ low-refractive-index L layer, $ZrO_2$ high-refractive-index H layer and $MgF_2$ low-refractive-index L layer.

Further, in the above preparation method, in a two-component material film structure, namely a structure that contains films made of two kinds of materials, the difference between the refractive index of the high-refractive-index H layer and the refractive index of the low-refractive-index L layer is equal to or greater than 0.5. The greater the difference in refractive index between two layers, the better the optical performance.

Further, in the above preparation method, the base substrate is a glass, crystal or sapphire substrate.

Further, in the above preparation method, the precursor I is one selected from the group consisting of $SiH_4$, $SiHCl_3$, $SiCl_2H_2$, $SiCl_4$, $Al(CH_3)_3$ and $Cp_2Mg$. The precursor II is at least one selected from the group consisting of $O_2$, $O_3$, $CO_2$, CO, $NO_2$, NO, $H_2O$ and $F_2$. The precursor III is one selected from the group consisting of $TiH_4$, $TiCl_4$, $NbCl_5$, $TaCl_5$ and $ZrCl_4$. The precursor IV is at least one selected from the group consisting of $O_2$, $O_3$, $CO_2$, CO, $NO_2$, NO, $H_2O$ and $F_2$.

A multilayer film structure, as shown in FIG. 1, is prepared by the above CVD preparation method, wherein the number of dots with a size greater than or equal to 1 μm is 0, and a surface roughness Ra of the multilayer film structure ranges from 0.01 nm to 20 nm. The CVD preparation method includes performing bombardment modification on the currently deposited layer with plasma after the completion of the deposition of each layer of the film structure and before the deposition of the next layer of the film structure. The plasma used in the modification has a voltage of 100-1000 V and a current of 100-1000 mA, and the time is preferably 1-2 minutes to avoid affecting the performance and thickness of the deposited film layer.

A CLCC package cover plate includes a cover plate substrate and a functional film covering the cover plate substrate, and the functional film includes a multilayer film structure. The multilayer film structure is deposited by the above CVD preparation method, which includes performing bombardment modification on the currently deposited layer with plasma after the completion of the deposition of each layer of the film structure and before the deposition of the next layer of the film structure. The conventional CVD deposition process is only suitable for single-layer film deposition. During the deposition of the multilayer film structure, after the previous layer of film is deposited, the next layer of film cannot be successfully deposited due to a change in the deposition surface. In the present invention, the multilayer film is successfully deposited through the surface modification by plasma bombardment after each layer of the film structure.

Figure 2:
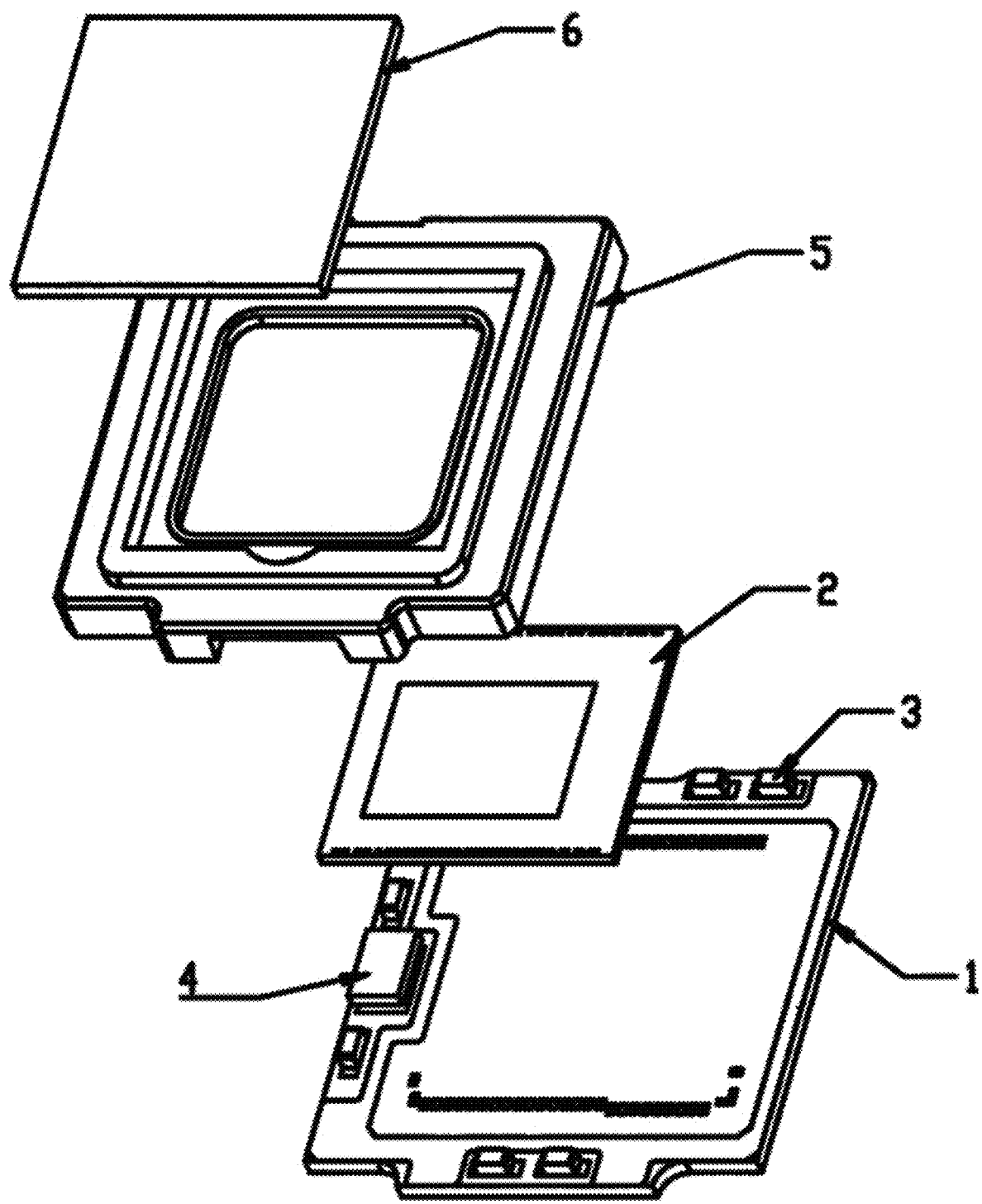
FIG. 2 is a structural schematic diagram of the CLCC package of the present invention.

A CLCC package, as shown in FIG. 2, includes the substrate 1. The CMOS 2 is attached in the middle of the substrate 1. The capacitor resistor 3 and the driving motor 4 are attached on the edge of the substrate 1. The separation wall base 5 is provided on the substrate 1. A CMOS sensor vacancy, a capacitor resistor vacancy and a driving motor vacancy are provided at positions on the separation wall base 5 corresponding to the CMOS 2, the capacitor resistor 3 and the driving motor 4 on the substrate, respectively. The cover plate 6 is mounted on the upper surface of the CMOS sensor vacancy.

A camera module, includes the CLCC package as described above.

Embodiment 1

Figure 3:
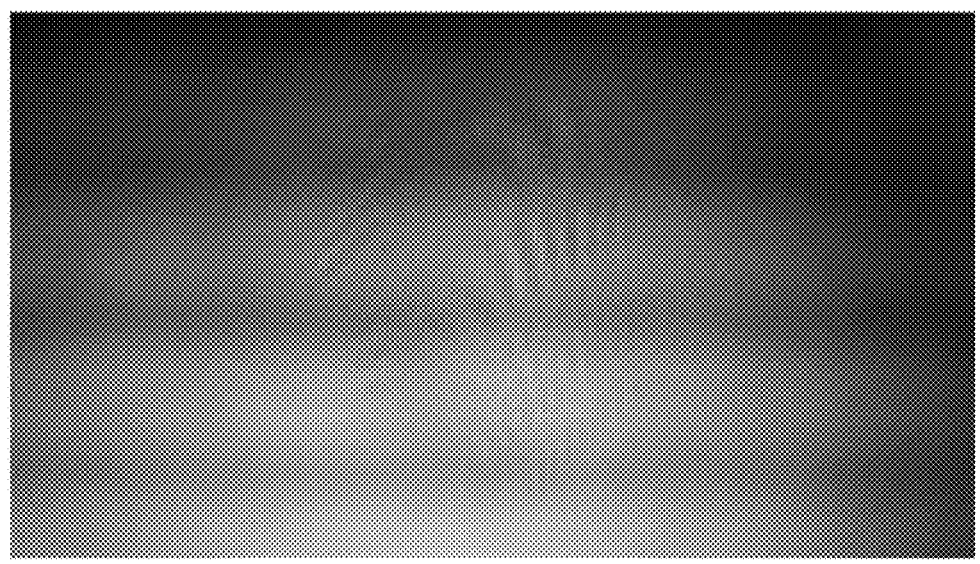
FIG. 3 is a schematic diagram of the cover plate of Embodiment 1 observed under a metallurgical microscope with a 10× ocular lens and a 100× objective lens.
Figure 4:
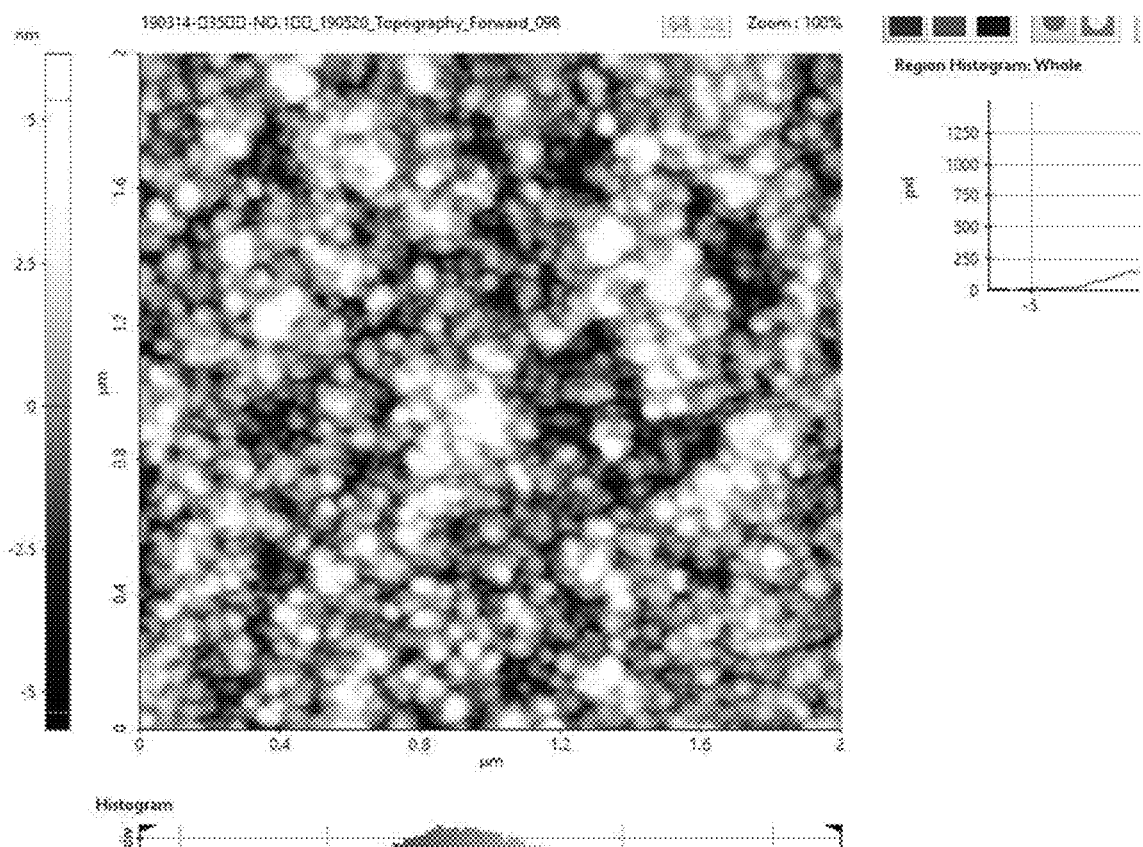
FIG. 4 is an Atomic Force Microscopy (AFM) image of the surface of the cover plate of Embodiment 1.
Figure 4:
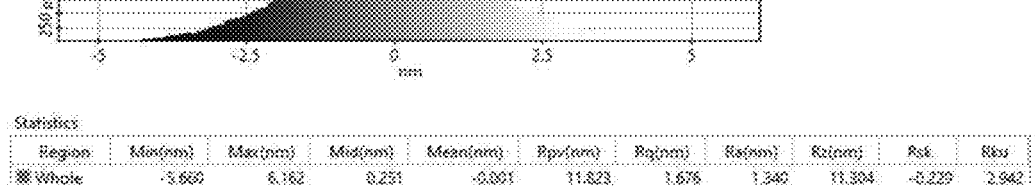
Figure 5:
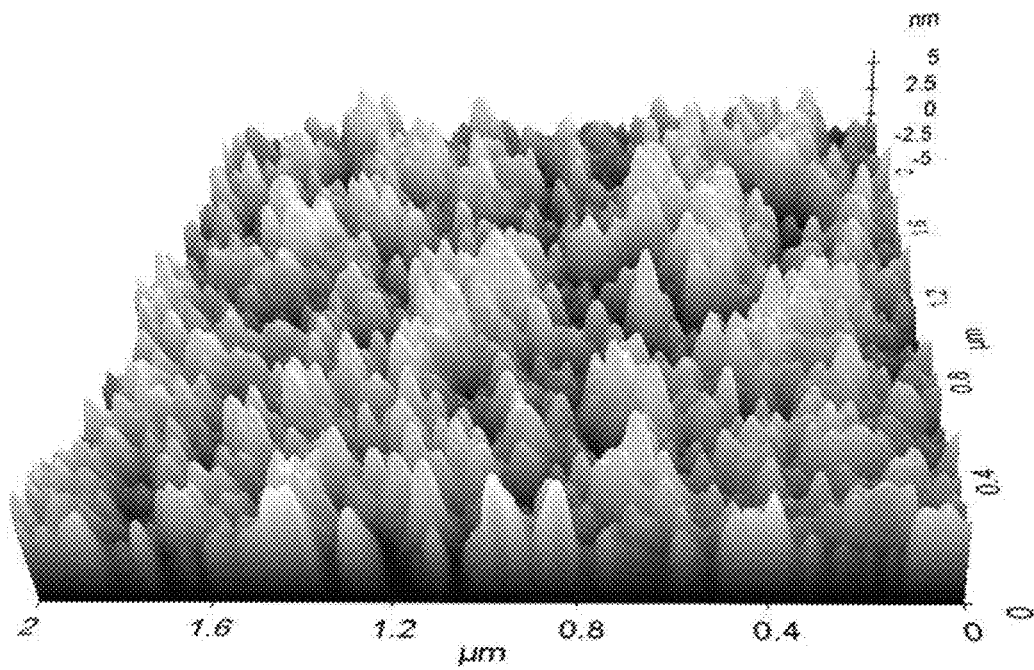
FIG. 5 is a three-dimensional AFM image of the surface of the cover plate of Embodiment 1.

A camera module, includes a CLCC package. The CLCC package includes the substrate 1. The CMOS 2 is attached in the middle of the substrate 1. The capacitor resistor 3 and the driving motor 4 are attached on the edge of the substrate 1. The separation wall base 5 is provided on the substrate 1. A CMOS sensor vacancy, a capacitor resistor vacancy and a driving motor vacancy are provided at positions on the separation wall base 5 corresponding to the CMOS 2, the capacitor resistor 3 and the driving motor 4 on the substrate, respectively. The cover plate 6 is mounted on the upper surface of the CMOS sensor vacancy. The size of the particle on the surface of the cover plate 6 is less than or equal to 10 nm, and the roughness Ra of the cover plate 6 is 1.135 nm, as shown in FIGS. 3-5.

The above cover plate is an optical element of the camera module in which a glass substrate is coated with a $SiO_2$ low-refractive-index L layer and a $TiO_2$ high-refractive-index H layer. The low-refractive-index L layer has a thickness of 100-200 nm and a refractive index of 1.46-1.50. The high-refractive-index H layer has a thickness of 350-650 nm and a refractive index of 2.28-2.35.

The above cover plate is prepared by the CVD preparation method, including the following steps:

Step S1: Pretreatment, the glass base substrate is firstly placed and cleaned in an ultrasonic cleaner for 60 minutes, and dried to obtain a pre-treated base substrate.

Step S2: The pre-treated glass base substrate is placed in a reaction chamber, the reaction chamber is evacuated to 0.1-5 Torr, and nitrogen or inert gas is introduced.

Step S3: Then, silane and oxygen are introduced into the reaction chamber in a pulse mode at 650-700° C. at a flow rate of 60 sccm and a flow rate of 30 sccm, respectively, for 0.015 s and 2000 cycles, to deposit $SiO_2$ on the base substrate to form a low-refractive-index L layer, wherein a thickness of the low-refractive-index L layer is 100-200 nm.

Step S4: Introduction of the raw gas silane and oxygen is halted, the reaction chamber is purged with nitrogen or inert gas, and surface modification is performed through plasma bombardment.

Step S5: At 700-800° C., $TiCl_4$ and $O_2$ are introduced into the reaction chamber at a flow rate of 30 sccm and a flow rate of 30 sccm, respectively, for 0.015 s and 2000 cycles, to deposit a $TiO_2$ high-refractive-index H layer on the low-refractive-index L layer through the reaction, wherein the thickness of the high-refractive-index H layer is 350-650 nm.

Step S6: Introduction of the raw gas $TiCl_4$ and $O_2$ is halted, and the reaction chamber is purged with nitrogen or inert gas.

Step S7: The reaction chamber is cooled to room temperature to obtain an optical element with coating films having different refractive indices.

In the present embodiment, the products produced in batches have a diameter of 300 mm and 12 substrates are produced in each batch. The particle condition is monitored through the metallographic microscope, no particles with a particle size greater than 1 μm are observed on all the cover plates, and the qualification rate is 100%. The particle size is further observed, and no particles with a particle size greater than 10 nm are observed.

Embodiment 2

A camera module includes a CLCC package. The CLCC package includes the substrate 1. The CMOS 2 is attached in the middle of the substrate 1. The capacitor resistor 3 and the driving motor 4 are attached on the edge of the substrate 1. The separation wall base 5 is provided on the substrate 1. A CMOS sensor vacancy, a capacitor resistor vacancy and a driving motor vacancy are provided at positions on the separation wall base 5 corresponding to the CMOS 2, the capacitor resistor 3 and the driving motor 4 on the substrate, respectively. The cover plate 6 is mounted on the upper surface of the CMOS sensor vacancy. The size of particle on the surface of the cover plate 6 is less than or equal to 10 nm, and the roughness Ra of the cover plate 6 is 0.433 nm.

The above cover plate is an optical element of the camera module in which a crystal substrate is coated with a $SiO_2$ low-refractive-index L layer and a $Nb_2O_5$ high-refractive-index H layer. The low-refractive-index L layer has a thickness of 20-50 nm and a refractive index of 1.46-1.50. The high-refractive-index H layer has a thickness of 10-100 nm and a refractive index of 2.1-2.3.

The above cover plate is prepared by the CVD preparation method, including the following steps:

Step S1: Pretreatment, the crystal base substrate is firstly placed and cleaned in an ultrasonic cleaner for 60 minutes, and dried to obtain a pre-treated base substrate.

Step S2: The pre-treated crystal base substrate is placed into a reaction chamber, the reaction chamber is evacuated to 0.1-5 Torr, and nitrogen or inert gas is introduced.

Step S3: Then, at 550-650° C., silane and oxygen are introduced into the reaction chamber at a flow rate of 10 sccm and a flow rate of 20 sccm, respectively, for 0.010 s and 1000 cycles, to deposit $SiO_2$ on the base substrate to form a low-refractive-index L layer, wherein the thickness of the low-refractive-index L layer is 20-50 nm.

Step S4: Introduction of the raw gas silane and oxygen is halted, and the reaction chamber is purged with nitrogen or inert gas, and surface modification is performed through plasma bombardment.

Step S5: At 700-800° C., $NbCl_5$ and $O_3$ are introduced into the reaction chamber at a flow rate of 20 sccm and a flow rate of 20 sccm, respectively, for 0.001 s and 1000 cycles, to deposit a $Nb_2O_5$ high-refractive-index H layer on the low-refractive-index L layer through the reaction, wherein the thickness of the high-refractive-index H layer is 10-100 nm.

Step S6: Introduction of the raw gas $NbCl_5$ and $O_3$ is halted, and the reaction chamber is purged with nitrogen or inert gas.

Step S7: The reaction chamber is cooled to room temperature to obtain an optical element with coating films having different refractive indices.

In the present embodiment, the products produced in batches have a diameter of 80*76*0.21 mm and 156 substrates are produced in each batch. The particle condition is monitored through the metallographic microscope, and no particles with a size greater than 1 μm are observed on all the cover plates. The particle size is further observed, and no particles with a size greater than 10 nm are not observed.

Embodiment 3

A camera module includes a CLCC package. The CLCC package includes the substrate 1. The CMOS 2 is attached in the middle of the substrate 1. The capacitor resistor 3 and the driving motor 4 are attached on the edge of the substrate 1. The separation wall base 5 is provided on the substrate 1. A CMOS sensor vacancy, a capacitor resistor vacancy and a driving motor vacancy are provided at positions on the separation wall base 5 corresponding to the CMOS 2, the capacitor resistor 3 and the driving motor 4 on the substrate, respectively. The cover plate 6 is mounted on the upper surface of the CMOS sensor vacancy. The size of the particle on the surface of the cover plate 6 is less than or equal to 100 nm, and the roughness Ra of the cover plate 6 is 5.962 nm.

The above cover plate is an optical element of the camera module in which a sapphire substrate is coated with a $MgF_2$ low-refractive-index L1 layer, an $Al_2O_3$ high-refractive-index H layer and a $SiO_2$ low-refractive-index L2 layer. The $MgF_2$ low-refractive-index L1 layer has a thickness of 10-20 nm and a refractive index of 1.35-1.4. The $Al_2O_3$ high-refractive-index H layer has a thickness of 100-200 nm and a refractive index of 1.54-1.62. The $SiO_2$ low-refractive-index L2 layer has a thickness of 200-300 nm and a refractive index of 1.45-1.47.

The above cover plate is prepared by the CVD preparation method, including the following steps:

Step S1: Pretreatment, the sapphire base substrate is firstly placed and cleaned in an ultrasonic cleaner for 60 minutes, and dried to obtain a pre-treated base substrate.

Step S2: The pre-treated sapphire base substrate is placed into a reaction chamber, the reaction chamber is evacuated to 0.1-5 Torr, and nitrogen or inert gas is introduced.

Step S3: Then, at 500-700° C., Magnesocene ($Cp_2Mg$) and fluorine ($F_2$) are introduced to the reaction chamber at a flow rate of 80 sccm and a flow rate of 80 sccm, respectively, for 0.005 s and 800 cycles, to deposit $MgF_2$ on the base substrate to form a low-refractive-index L1 layer, wherein the thickness of the low-refractive-index L1 layer is 10-20 nm.

Step S4: Introduction of $Cp_2Mg$ and $F_2$ is halted, and the reaction chamber is purged with nitrogen or inert gas, and surface modification is performed through plasma bombardment.

Step S5: At 600-750° C., $Al(CH_3)_3$ and $CO_2$ are introduced into the reaction chamber at a flow rate of 90 sccm and a flow rate of 60 sccm, respectively, for 0.015 s and 2000 cycles, to deposit an $Al_2O_3$ high-refractive-index H layer on the low-refractive-index L layer through the reaction, wherein the thickness of the high-refractive-index H layer is 100-200 nm.

Step S6: Introduction of the $Al(CH_3)_3$ and $CO_2$ is halted, and the reaction chamber is purged with nitrogen or inert gas.

Step S7: Then, at 650-700° C., silane and oxygen are introduced into the reaction chamber at a flow rate of 80 sccm and a flow rate of 80 sccm, respectively, for 0.025 s and 3000 cycles, to deposit $SiO_2$ on the base substrate to form a low-refractive-index L2 layer, wherein the thickness of the low-refractive-index L layer is 200-300 nm.

Step S8: Introduction of the silane and oxygen is halted, and the reaction chamber is purged with nitrogen or inert gas.

Step S9: The reaction chamber is cooled to room temperature to obtain an optical element with coating films having different refractive indices.

In the present embodiment, the products produced in batches have a diameter of 200 mm and 21 substrates are produced in each batch. The particle condition is monitored through the metallographic microscope, and no particles with a size greater than 1 μm are observed on all the cover plates, and the qualification rate is 100%. The particle size is further observed, and no particles with a size greater than 100 nm are observed.

Comparative Embodiment

The target product of the present embodiment is the same as that of Embodiment 1, and the adopted vacuum thermal evaporation preparation method includes the following steps:

Step S1: A base substrate glass is firstly placed in a holder, the holder is placed on an umbrella-shaped rack, and the umbrella-shaped rack is placed in a chamber of a coating machine.

Step S2: $SiO_2$ and $TiO_2$ are placed into crucibles at the left side and the right side of the machine chamber, respectively, the door of the machine chamber is closed, the machine chamber is evacuated to 0.0001-0.001 Pa, and the temperature is set within a range of 50-400° C., wherein the internal pressure of the machine chamber is maintained in the evacuation range.

Step S3: An electronic gun at the position where $SiO_2$ is located is turned on. The electronic gun, according to a set film thickness, is stopped when the thickness is reached, and the remaining molecules are pumped by the gas after the electronic gun is stopped. An electronic gun at the position where $TiO_2$ is located is automatically turned on to perform film coating.

Step S4: The machine performs cycle coating according to the set number of coating film layers.

Figure 6:
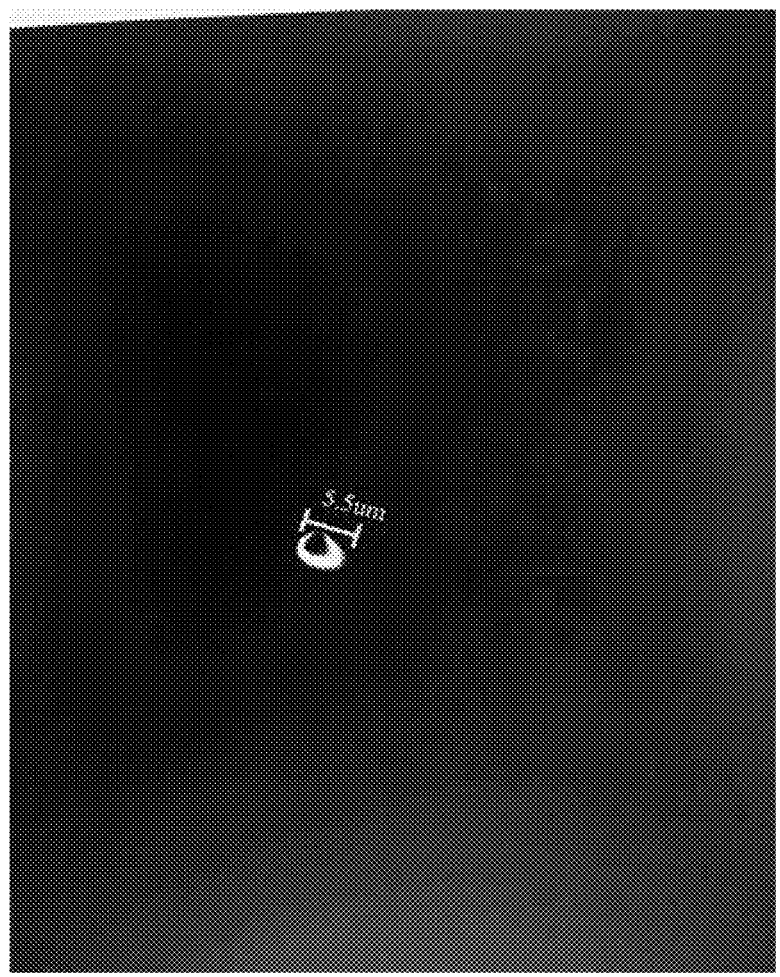
FIG. 6 is a schematic diagram of the cover plate of a Comparative Embodiment observed under the metallurgical microscope with the 10× ocular lens and the 100× objective lens.

For the products of the Comparative Embodiment, the dot condition is monitored by a metallographic microscope, and the result thereof is shown in FIG. 6. The dot defect with a particle size greater than or equal to 5 μm can be observed. After batch testing, the defect rate of the products obtained using the preparation method due to the dot defect (a particle size greater than or equal to 5 μm) is 70%.

The foregoing embodiments are only used to illustrate the present invention rather than to limit the present invention. Those having ordinary skill in the art can make various changes and transformations without departing from the spirit and scope of the present invention. Therefore, all equivalent technical solutions belong to the scope of the present invention, and the scope of protection of the present invention shall be defined by the claims.

What is claimed is:

1. A CVD preparation method for minimizing camera module dot defects, comprising the following steps:
   S1: performing ultrasonic cleaning and drying on a base substrate to obtain a pre-treated base substrate;
   S2: placing the pre-treated base substrate into a reaction chamber, evacuating the reaction chamber, and introducing first nitrogen or a first inert gas into the reaction chamber to a slightly positive pressure;
   S3: simultaneously introducing a first raw gas precursor and a second raw gas precursor at a temperature of 500-700° C. to deposit and form a low-refractive-index-layer on the base substrate, wherein a flow rate of the first raw gas precursor is 10-80 sccm, and a flow rate of the second raw gas precursor is 20-80 sccm;
   S4: halting introduction of the first raw gas precursor and the second raw gas precursor, and purging the reaction chamber with second nitrogen or a second inert gas;
   S5: introducing a third raw gas precursor and a fourth raw gas precursor at a temperature of 600-800° C. to deposit a high-refractive-index layer on the low-refractive-index layer, wherein a flow rate of the third raw gas precursor is 20-90 sccm, and a flow rate of the fourth raw gas precursor IV is 20-60 sccm;
   S6: halting introduction of the third raw gas precursor and the fourth raw gas precursor, and purging the reaction chamber with third nitrogen or a third inert gas; and
   S7: cooling the reaction chamber to room temperature to obtain an optical element with coating films having different refractive indices; wherein a refractive index of the high-refractive-index layer is greater than a refractive index of the low-refractive-index layer, further comprising performing a bombardment with plasma after completion of the deposition of each layer and before the deposition of the next layer, wherein the plasma used in the bombardment has a voltage of 100-1000 V, a current of 100-1000 mA, and wherein the bombardment time is 1 to 2 minutes.

2. The CVD preparation method for minimizing the camera module dot defects of claim 1, wherein, steps S3-S4 and/or steps S5-S6 are periodically repeating.

3. The CVD preparation method for minimizing the camera module dot defects of claim 2, wherein, the coating films of the optical element comprise: a combination of a $SiO_2$ low-refractive-index layer and a $TiO_2$ high-refractive-index layer; a combination of the $SiO_2$ low-refractive-index layer and a $Nb_2O_5$ high-refractive-index layer; a combination of the $SiO_2$ low-refractive-index layer and a $Ta_2O_5$ high-refractive-index layer; a combination of a $MgF_2$ low-refractive-index layer and the $TiO_2$ high-refractive-index layer; a combination of the $MgF_2$ low-refractive-index layer and the $Nb_2O_5$ high-refractive-index layer; a combination of a $Nb_2O_5$ low-refractive-index layer and the $Ta_2O_5$ high-refractive-index layer; a combination of the $MgF_2$ low-refractive-index layer, an $Al_2O_3$ high-refractive-index layer and the $SiO_2$ low-refractive-index layer; a combination of an $Al_2O_3$ low-refractive-index layer, a lanthanum titanium oxide high-refractive-index layer and the $MgF_2$ low-refractive-index layer; and a combination of the $Al_2O_3$ low-refractive-index layer, a $ZrO_2$ high-refractive-index layer and the $MgF_2$ low-refractive-index layer.

4. The CVD preparation method for minimizing the camera module dot defects of claim 3, wherein, a difference between a refractive index of the $TiO_2$ high-refractive-index layer and a refractive index of the $SiO_2$ low-refractive-index layer is greater than or equal to 0.5;

a difference between a refractive index of the $Nb_2O_5$ high-refractive-index layer and the refractive index of the $SiO_2$ low-refractive-index layer is greater than or equal to 0.5;

a difference between a refractive index of the $Ta_2O_5$ high-refractive-index layer and the refractive index of the $SiO_2$ low-refractive-index layer is greater than or equal to 0.5;

a difference between the refractive index of the $TiO_2$ high-refractive-index layer and a refractive index of the $MgF_2$ low-refractive-index layer is greater than or equal to 0.5;

a difference between the refractive index of the $Nb_2O_5$ high-refractive-index layer and the refractive index of the $MgF_2$ low-refractive-index layer is greater than or equal to 0.5; and a difference between the refractive index of the $Ta_2O_5$ high-refractive-index layer and a refractive index of the $Nb_2O_5$ low-refractive-index layer is greater than or equal to 0.5.

5. The CVD preparation method for minimizing the camera module dot defects of claim 1, wherein, the base substrate is one selected from the group consisting of a glass substrate, a crystal substrate and a sapphire substrate.

6. The CVD preparation method for minimizing the camera module dot defects of claim 3, wherein, the first raw gas precursor is one selected from the group consisting of $SiH_4$, $SiHCl_3$, $SiCl_2H_2$, $SiCl_4$, $Al(CH_3)_3$ and $Cp_2Mg$; the second raw gas precursor is at least one selected from the group consisting of $O_2$, $O_3$, $CO_2$, $CO$, $NO_2$, $NO$, $H_2O$ and $F_2$; the third raw gas precursor is one selected from the group consisting of $TiH_4$, $TiCl_4$, $NbCl_5$, $TaCl_5$ and $ZrCl_4$; and the fourth raw gas precursor is at least one selected from the group consisting of $O_2$, $O_3$, $CO_2$, $CO$, $NO_2$, $NO$, $H_2O$ and $F_2$.

* * * * *